(12) United States Patent
Kuo et al.

(10) Patent No.: US 10,490,534 B2
(45) Date of Patent: Nov. 26, 2019

(54) DISPLAY DEVICE WITH LED PIXELS

(71) Applicant: Innolux Corporation, Miao-Li County (TW)

(72) Inventors: Shu-Ming Kuo, Miao-Li County (TW); Chih-Yung Hsieh, Miao-Li County (TW); Li-Wei Mao, Miao-Li County (TW); Tsau-Hua Hsieh, Miao-Li County (TW); Tung-Kai Liu, Miao-Li County (TW); Chia-Hsiu Hsu, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 97 days.

(21) Appl. No.: 15/599,472

(22) Filed: May 19, 2017

(65) Prior Publication Data
US 2017/0338212 A1    Nov. 23, 2017

Related U.S. Application Data

(60) Provisional application No. 62/339,107, filed on May 20, 2016, provisional application No. 62/350,169, (Continued)

(30) Foreign Application Priority Data
Nov. 22, 2016   (CN) .......................... 2016 1 1031711

(51) Int. Cl.
*H01L 33/62* (2010.01)
*H01L 25/16* (2006.01)
(Continued)

(52) U.S. Cl.
CPC .......... *H01L 25/167* (2013.01); *H01L 27/124* (2013.01); *H01L 27/1222* (2013.01);
(Continued)

(58) Field of Classification Search
CPC . H01L 25/167; H01L 27/1222; H01L 27/124; H01L 27/1248; H01L 27/1225;
(Continued)

(56) References Cited

U.S. PATENT DOCUMENTS

2009/0003882 A1* 1/2009 Nakamura ................. B41J 2/45
                                                          399/220
2015/0041791 A1* 2/2015 Lee ..................... H01L 27/3276
                                                          257/40

FOREIGN PATENT DOCUMENTS

CN     103794628     5/2014
CN     105097878     11/2015

OTHER PUBLICATIONS

"Office Action of China Counterpart Application," dated May 29, 2019, p. 1-p. 6.

* cited by examiner

*Primary Examiner* — Joseph C. Nicely
*Assistant Examiner* — Pavel G Ivanov
(74) *Attorney, Agent, or Firm* — JCIPRNET

(57) ABSTRACT

The disclosure relates to a display device, including a first substrate, a light emitting component, an insulating layer, and a conductive element. The first substrate has a driving component and a common line. The light emitting component is disposed on the first substrate and has a first electrode and a second electrode. The first electrode is electrically connected to the driving component. The insulating layer is disposed to the first substrate and has a first opening and a second opening. The first opening exposes the second electrode of the light emitting component. The second opening exposes the common line. The common line is electrically connected to the second electrode through the conductive element.

14 Claims, 21 Drawing Sheets

Related U.S. Application Data filed on Jun. 14, 2016, provisional application No. 62/361,543, filed on Jul. 13, 2016.

(51) Int. Cl.
*H01L 27/12* (2006.01)
*H01L 29/786* (2006.01)

(52) U.S. Cl.
CPC ...... H01L 27/1225 (2013.01); H01L 27/1248 (2013.01); H01L 33/62 (2013.01); *H01L 29/7869* (2013.01); *H01L 29/78633* (2013.01); *H01L 29/78663* (2013.01); *H01L 29/78672* (2013.01); *H01L 2933/0066* (2013.01)

(58) Field of Classification Search
CPC .............. H01L 33/62; H01L 29/78633; H01L 29/78672; H01L 2933/0066; H01L 29/7869; H01L 27/14603; H01L 27/15
See application file for complete search history.

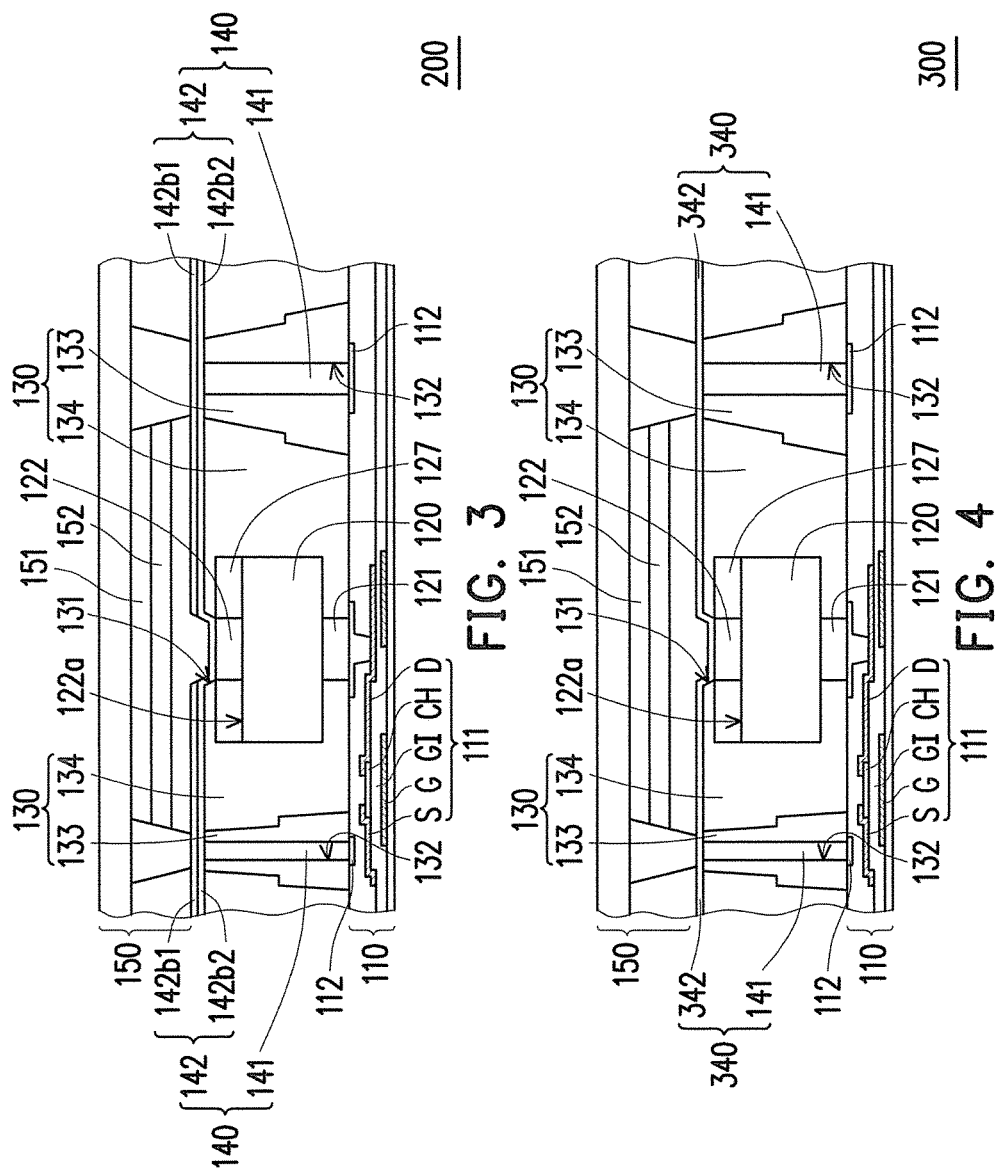

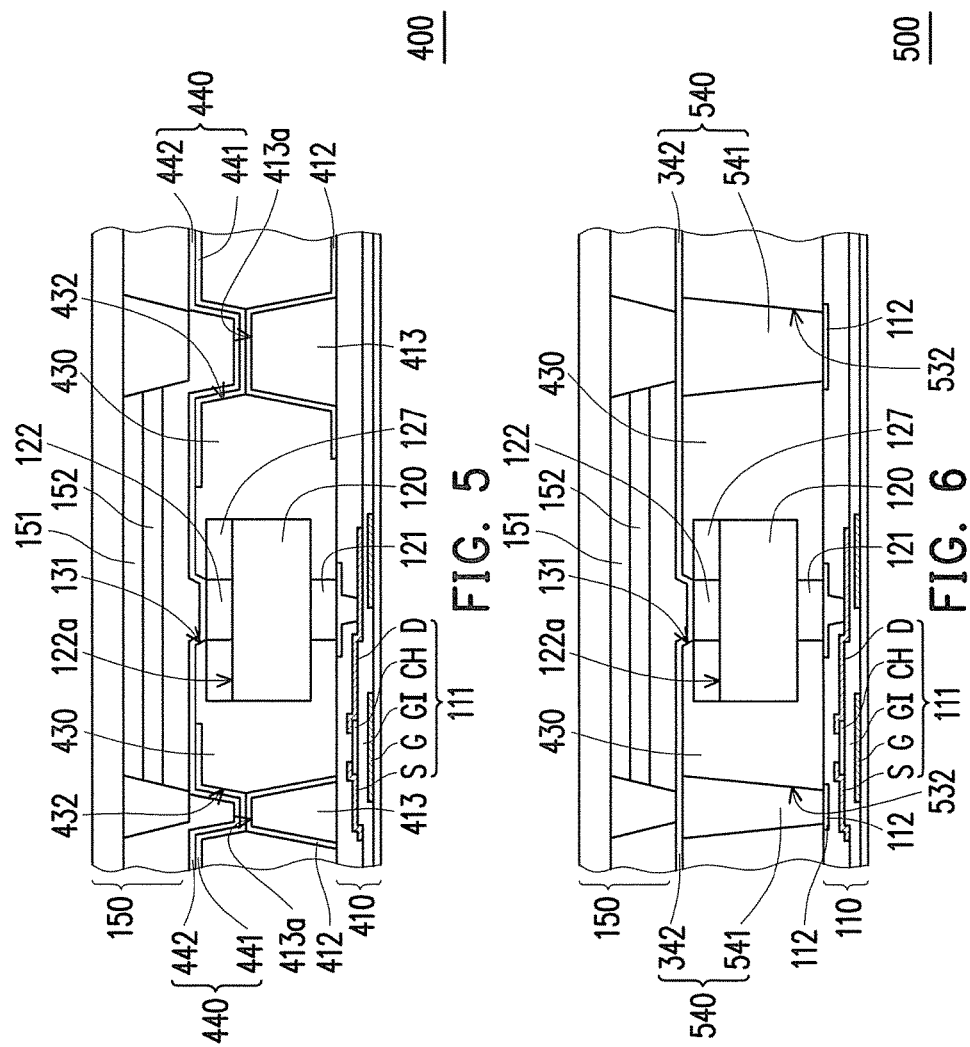

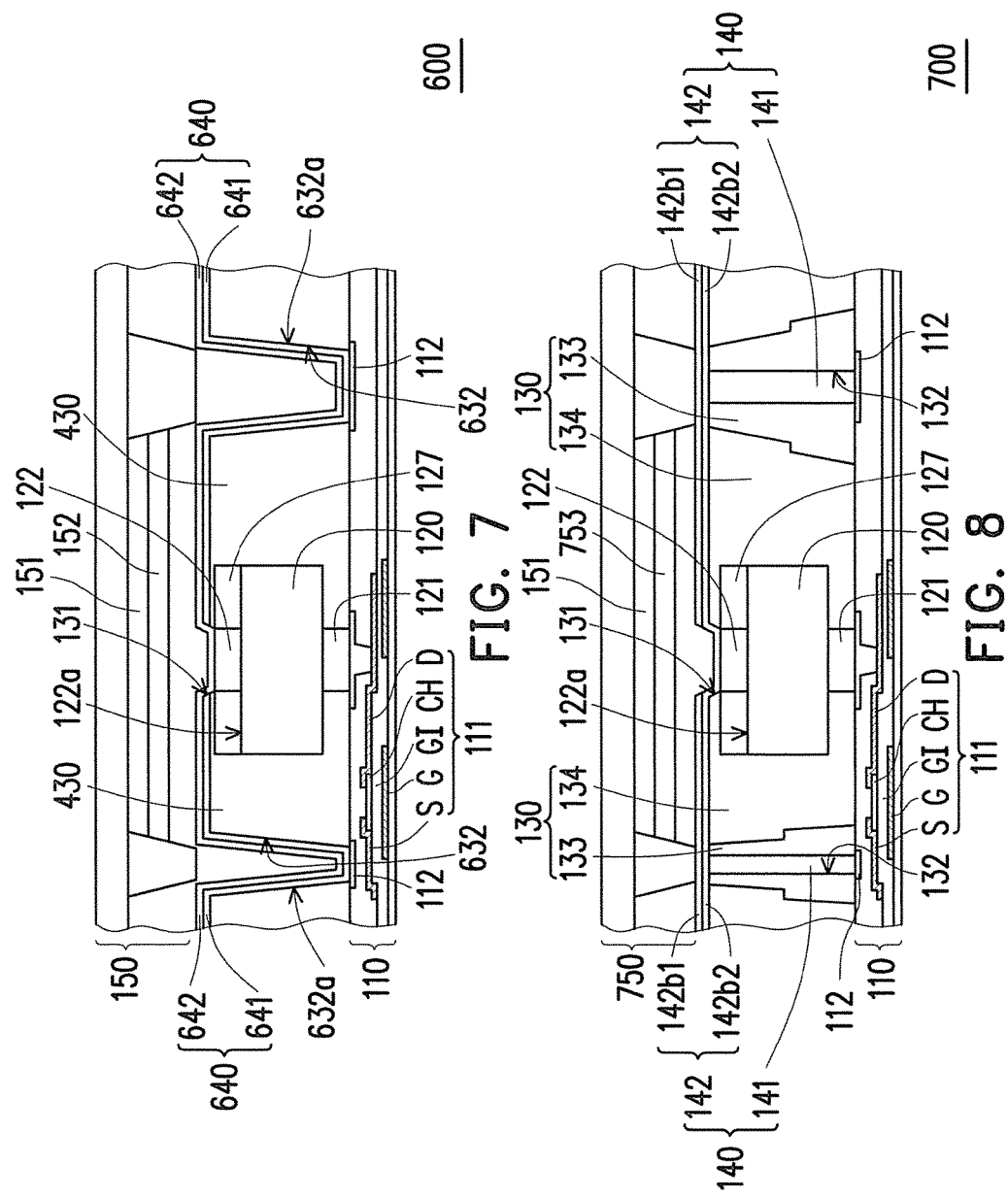

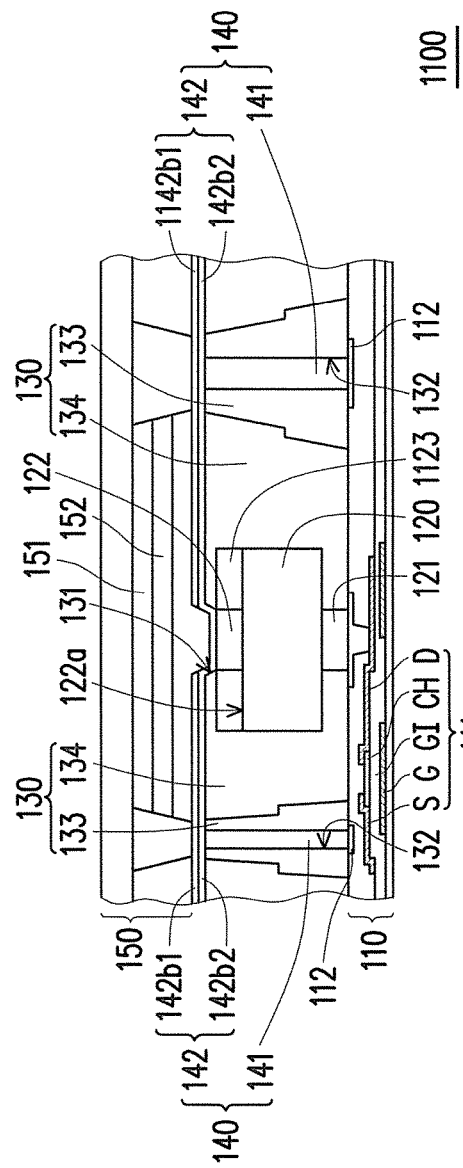
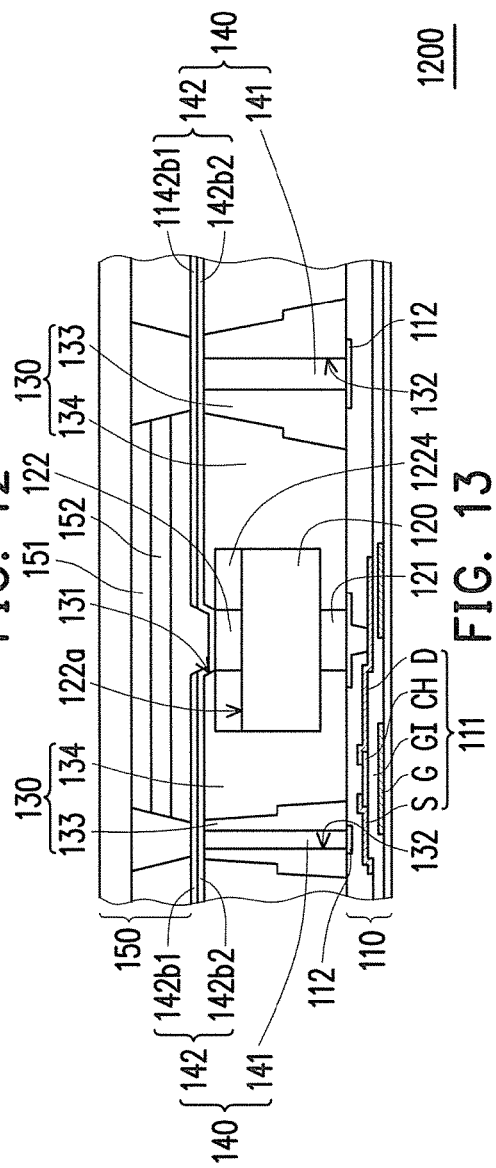
FIG. 12
FIG. 13

DISPLAY DEVICE WITH LED PIXELS

CROSS-REFERENCE TO RELATED APPLICATION

This application claims the priority benefits of U.S. provisional application Ser. No. 62/339,107, filed on May 20, 2016, U.S. provisional application Ser. No. 62/350,169, filed on Jun. 14, 2016, U.S. provisional application Ser. No. 62/361,543, filed on Jul. 13, 2016, and China application serial no. 201611031711.0, filed on Nov. 22, 2016. The entirety of each of the above-mentioned patent applications is hereby incorporated by reference herein and made a part of this specification.

TECHNICAL FIELD

The disclosure relates to a display device.

BACKGROUND

Light emitting diode (micro-LED) displays exhibit the characteristics of active light emission, high luminance, high contrast, and low power consumption, and are thus the display technologies in prosperous development in recent years. The technologies of the light emitting diode displays have become more and more matured through time. How to effectively reduce the electrical impedance to facilitate the performance of the light emitting diode has become an issue of the industry.

SUMMARY

The disclosure provides a display device capable of facilitating display performance.

A display device according to an embodiment of the disclosure includes a first substrate, a light emitting component, an insulating layer, and a conductive element. The first substrate has a driving component and a common line. The light emitting component is disposed on the first substrate and has a first electrode and a second electrode. The first electrode is electrically connected to the driving component. The insulating layer is disposed on the first substrate and has a first opening and a second opening. The first opening exposes the second electrode of the light emitting component. The second opening exposes the common line. The common line is electrically connected to the second electrode through the conductive element.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIGS. 3 to 8 are schematic partial cross-sectional views illustrating a display device according to second to seventh embodiments of the disclosure.

FIGS. 12 to 28 are schematic partial cross-sectional views illustrating a display device according to eleventh to twenty-seventh embodiments of the disclosure.

DETAILED DESCRIPTION OF DISCLOSED EMBODIMENTS

Figure 1:
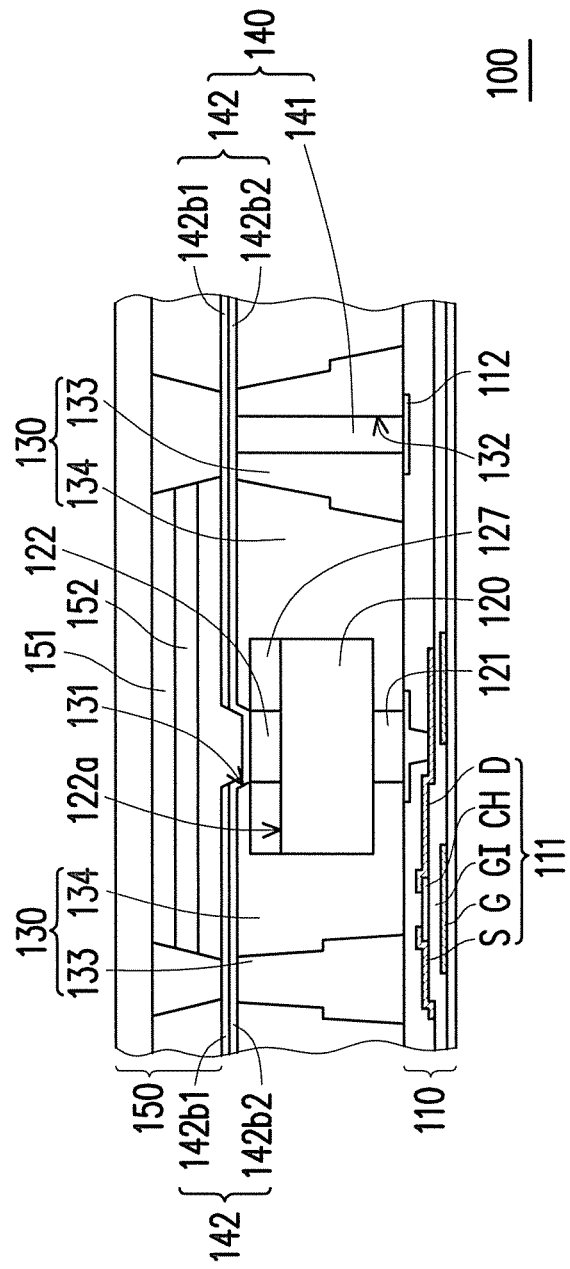
FIG. 1 is a schematic partial cross-sectional view illustrating a display device according to a first embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

The foregoing and other technical contents, features, and effects of the disclosure will be clearly described in the following detailed descriptions of the embodiments with reference to the accompanying drawings. The language used to describe the directions such as up, down, left, right, front, back or the like in the reference drawings is regarded in an illustrative rather than in a restrictive sense. Therefore, the directional wording is used to illustrate rather than limit the disclosure. For example, in the following descriptions, the description that a first object is on a second object covers the embodiment where the first object and the second object are in direct contact and the embodiment where the first object and the second object are not in direct contact. Besides, in the embodiment where the first object and the second object are not in direct contact, there may be another object or simply a space between the first object and the second object.

Figure 2:
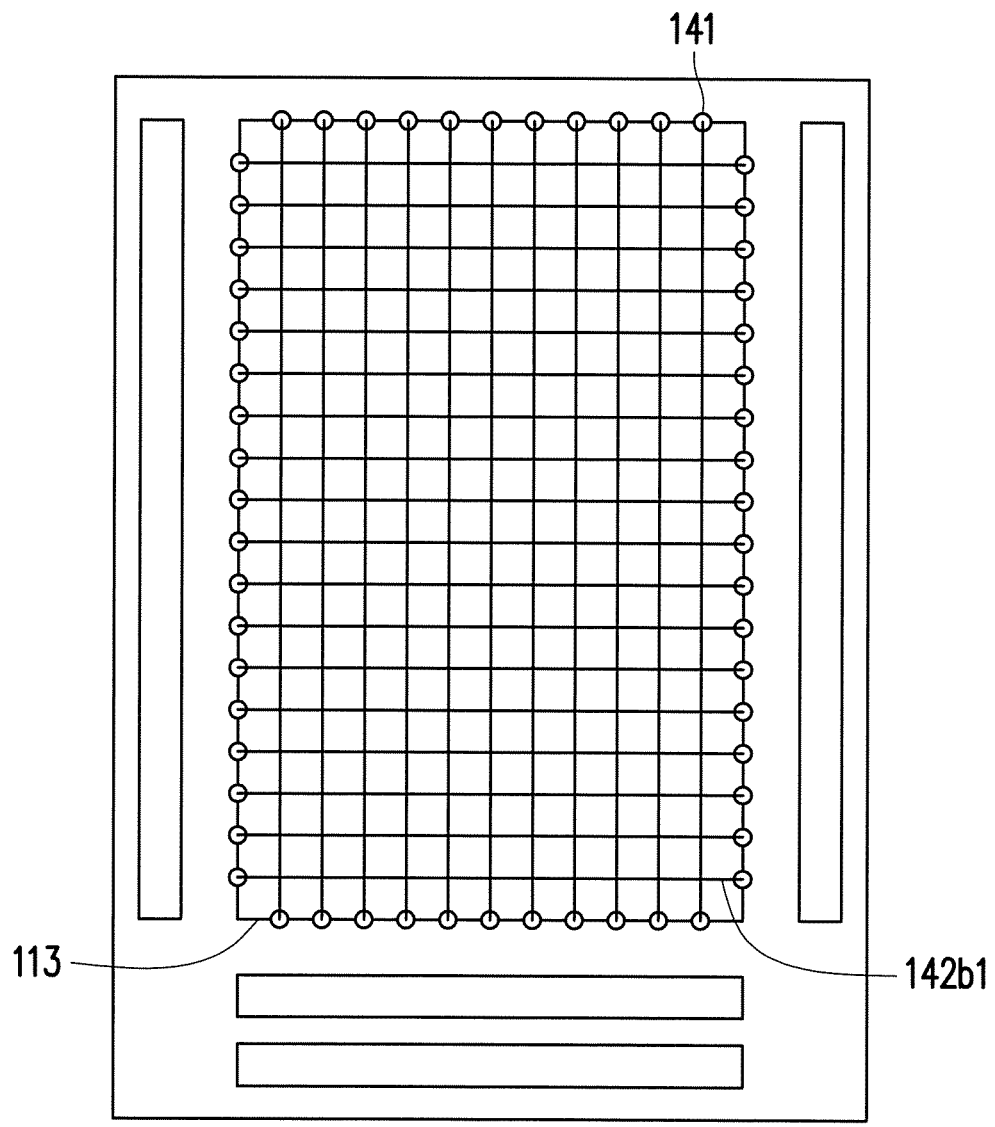
FIG. 2 is a schematic top view illustrating the display device according to the first embodiment of the disclosure.

FIGS. 1 and 2 are respectively a schematic partial cross-sectional view and a schematic top view illustrating a first embodiment of the disclosure. Referring to FIG. 1, the display device 100 includes a first substrate 110, a light emitting component 120, an insulating layer 130, and a conductive element 140. The first substrate 110 has a driving component 111 and a common line 112. The driving component 110, for example, includes a gate G, a gate insulating layer GI, a channel layer CH, a source S and a drain D. The channel layer CH is located above the gate G. The gate insulating layer GI separates the gate G from the channel layer CH, the source S, and the drain D. A portion of each of the source S and the drain D is located above the channel layer CH. The light emitting component 120 is disposed on the first substrate 110 and has a first electrode 121 and a second electrode 122. The first electrode 121 is disposed on the first substrate 110 and located between the first substrate 110 and the light emitting component 120. The first electrode 121 is electrically connected to the driving component 111. The insulating layer 130 is disposed on the first substrate 110 and has a first opening 131 and a second opening 132. The first opening 131 exposes the second electrode 122 of the light emitting component 120, and the second opening 132 exposes the common line 112. The conductive element 140 is disposed on the first substrate 110, and the conductive element 140 extends from the common line 112 to the second electrode 112. The common line 112 is electrically connected to the second electrode 122 through the conductive element 140.

In the display device 100 of the embodiment, the first substrate 110 has the common line 112 and the driving component 111, the conductive element 140 may extend upward from the common line 112 and be electrically connected with the second electrode 122. Thus, it neither requires to dispose the common line 112 or a common electrode to another substrate opposite to the first substrate 110, nor requires to align and bond the another substrate with the second electrode 122. According, the manufacturing time and cost are saved.

The light emitting component 120 of the embodiment includes, but is not limited to, a micro light emitting diode (Micro-LED). Here, a vertical Micro-LED is described in the embodiment as an example. However, it should be understood that the disclosure is not limited thereto. In other embodiments, the light emitting component 120 may also be a flip-chip Micro-LED. In another embodiment, an organic light emitting diode may also be adopted. Besides, in an embodiment, a length and a width of the light emitting component 120 may be respectively smaller than 300 μm, whereas a height of the light emitting component 120 may be smaller than 20 μm. The driving component 111 of the embodiment includes, for example, an amorphous silicon thin film transistor, an oxide semiconductor thin film transistor, a low-temperature polycrystalline silicon thin film transistor, a silicon-based thin film transistor, a microcrystalline silicon thin film transistor, or other driving components. Besides, in the embodiment, the driving component 111 is a bottom gate transistor. However, the disclosure is not limited thereto. In other embodiments, the driving component 111 may also be a top gate transistor.

In the embodiment, the conductive element 140 includes a first portion 141 and a second portion 142. The first portion 141 is located in the second opening 132, and the second portion 142 is located outside the second opening 132. In other words, a portion of the conductive element 140 filled in the second opening 132 is referred to as the first portion 141, and a portion of the conductive element 140 formed outside the second opening 132 is referred to as the second portion 142. The first portion and the second portion may be formed in a single process or in two stages. A material of the first portion 141 may include metal, such as gold, silver, titanium, nickel, copper, aluminum, molybdenum, palladium, neodymium, indium, tin, or a conductive oxide thereof. However, it should be noted that the material of the first portion is not limited thereto. The first portion 141 is formed in the second opening 132 by performing an electroplating process, for example. The first portion 141 is configured to electrically connect a transparent conductive material 142b2 and the common line 112.

In this embodiment, the second portion 142 is a composite layer of a metal 142b1 and the transparent conductive material 142b2. In the embodiment, the transparent conductive material 142b2 is formed as a complete surface (as shown in FIG. 1), whereas the metal 142b1 is arranged to be grid-like (as shown in FIG. 2). The metal 142b1 can reduce the influence of a high impedance of the transparent conductive material 142b2 on electrical connection between the light emitting component 120 and the common line 112, and thereby facilitates the display quality of the display device 100. Besides, since the metal 142b1 may shield and reflect light, designing the metal 142b1 to be grid-like may reduce the influence of the metal 142b1 on the aperture opening rate and display style. In another embodiment, an oxidation layer or a nitridation layer may be deposited on the metal 142b1, so as to form a black metal layer reducing the influence of the metal 142b1 on the aperture opening rate and display style.

Referring to FIGS. 1 and 2, in the embodiment, the first portion 141 is a metal column, for example. However, the disclosure is not limited thereto. The first portion 141 may be formed by performing a chemical deposition process and an electroplating process. When the display device 100 includes a plurality of the light emitting components 120 arranged into a plurality of groups, an area with the groups of the light emitting components 120 are referred to as an active area 113, namely an area for displaying a frame. The first portion 141 of the conductive element 140 may be disposed on a boundary of the active area 113 to reduce the influence on the displayed frame.

In the embodiment, the insulating layer 130 includes a light shielding column 133 and a filling material 134. The filling material 134 is filled between the light emitting component 120 and the light shielding column 133. The filling material 134 has the first opening 131, and the light shielding column 133 has the second opening 132. The filling material 134 may include a polymer, such as resin. However, the disclosure is not limited thereto. When the display device 100 has the light emitting components 120, disposing the light shielding column 133 allows to shield light emitted by the nearby light emitting components, so as to reduce the interference between the adjacent light emitting components 120. In an embodiment, the light shielding column 133 is a black material (BM) and able to effectively shield the light emitted by the nearby light emitting components. The light emitting component 120 includes, for example, a light emitting diode emitting white light, red light, green light, blue light, or light in other wave bands. However, the disclosure is not limited thereto.

In the embodiment, the light emitting component 120 includes a protection layer 127 disposed on a light emitting surface 122a of the light emitting component 120 and surrounding the second electrode 122. The second electrode 122 is electrically connected to the conductive element 140 through the first opening 131, so that the light emitting component 120 is electrically connected to the common line 112. The protection layer 127 includes, for example, $SiO_2$ or $SiN_x$. However, the disclosure is not limited thereto.

In the embodiment, the display device 100 further includes a second substrate 150 having a color filter film 151. The light emitting component 120 is located between the first substrate 110 and the color filter film 151. In addition, an orthogonal projection of the color filter film 151 on the first substrate 110 overlaps with an orthogonal projection of the light emitting component 120 on the first substrate 110. The orthogonal projection refers to a combination of projection points of projection lines parallel to each other at respective points passing through a projection object (the color filter film 151 and the light emitting component 120 here) on a projection surface (the surface of the first substrate 110 here), the projection lines parallel to each other being perpendicular to the projection surface. In other words, the orthogonal projection of the color filter film 151 projected onto the first substrate 110 through the parallel projection lines overlaps with the orthogonal projection of the light emitting component 120 projected onto the first substrate 110 through the parallel projection lines. In the embodiment, after the light emitted by the light emitting component 120 passes through the protection layer 127, the light may firstly pass through the color filter film 151 and then be emitted from the second substrate 150. Accordingly, a specific color is displayed.

In the embodiment, the second substrate 150 further includes a light scattering layer and/or a quantum dot layer located between the color filter layer 151 and the light emitting component 120. The embodiment takes a light scattering layer 152 as an example. However, the disclosure is not limited thereto. After the light emitted by the light emitting component 120 passes through the protection layer 127, the light may firstly pass through the light scattering layer 152, so that the light emitted from the display device 100 may become more uniform and gentle.

FIG. 3 is a schematic partial cross-sectional view illustrating a display device according to a second embodiment of the disclosure. In a display device 200 of FIG. 3, the same components are configured and function in a way similar to that of the embodiment of FIG. 1. For example, the light scattering layer 152 is similar to the light scattering layer 152 of FIG. 1. Therefore, details in this respect will not be repeated. In the embodiment, the insulating layer 130 includes a plurality of the light shielding columns 133 and a plurality of the filling materials 134. The conductive element 140 includes a plurality of the first portions 141, so as to further reduce an overall impedance of the conductive element 140. The embodiment is applicable in a serial circuit.

FIG. 4 is a schematic partial cross-sectional view illustrating a display device according to a third embodiment of the disclosure. In a display device 300 shown in FIG. 4, the same components are configured and function in a way similar to that of the embodiment of FIG. 3. Thus, details in this respect will not be repeated in the following. In the embodiment, a second portion 342 of a conductive element 340 may comprise a uniform transparent conductive layer, so as to reduce the complexity of the conductive element 340 to thereby simplify and facilitate the overall manufacturing process of the display device 300.

FIG. 5 is a schematic partial cross-sectional view illustrating a display device according to a fourth embodiment of the disclosure. In a display device 400 shown in FIG. 5, the same components are configured and function in a way similar to that of the embodiment of FIG. 1. Thus, details in this respect will not be repeated in the following. In the embodiment, an insulating layer 430 is a uniform material layer. The display device 400 further includes a black matrix 413. The common line 412 is located between the black matrix 413 and a conductive element 440. The common line 412 climbs up to a top surface 413*a* of the black matrix 413, and a second opening 432 is located above the top surface 413*a* of the black matrix 413. In the embodiment, the common line 412 disposed on the top surface 413*a* of the black matrix 413 is firstly electrically connected with a first portion 441 of the conductive element 440 and then electrically connected with the second electrode 122 through a second portion 442 of the conductive element 440.

FIG. 6 is a schematic partial cross-sectional view illustrating a display device according to a fifth embodiment of the disclosure. In a display device 500 shown in FIG. 6, the same components are configured and function in a way similar to that of the embodiment of FIG. 4. Thus, details in this respect will not be repeated in the following. In the embodiment, a first portion 541 of a conductive element 540 fills a second opening 532. In the embodiment, merely metal is used in the second opening 532, so as to further reduce the structural complexity and facilitate the efficiency of the overall manufacturing process of the display device 500.

FIG. 7 is a schematic partial cross-sectional view illustrating a display device according to a sixth embodiment of the disclosure. In a display device 600 shown in FIG. 7, the same components are configured and function in a way similar to that of the embodiment of FIG. 6. Thus, details in this respect will not be repeated in the following. In the embodiment, a first portion 641 and a second portion 642 of a conductive element 640 only cover a wall 632*a* of a second opening 632. In the embodiment, the first portion 641 only requires a smaller amount of material to reduce the cost of material.

FIG. 8 is a schematic partial cross-sectional view illustrating a display device according to a seventh embodiment of the disclosure. In a display device 700 shown in FIG. 8, the same components are configured and function in a way similar to that of the embodiment of FIG. 3. Thus, details in this respect will not be repeated in the following. In the embodiment, a second substrate 750 further includes a light scattering layer and/or a quantum dot layer 753 located between the color filter layer 151 and the light emitting component 120. The embodiment takes the quantum dot layer 753 as an example. However, the disclosure is not limited thereto. After the light emitted by the light emitting component 120 passes through the protection layer 127, the light may pass through the quantum dot layer 753 capable of converting the wavelength of the light passing through. Accordingly, the display device 700 may display a desired color.

Figure 9:
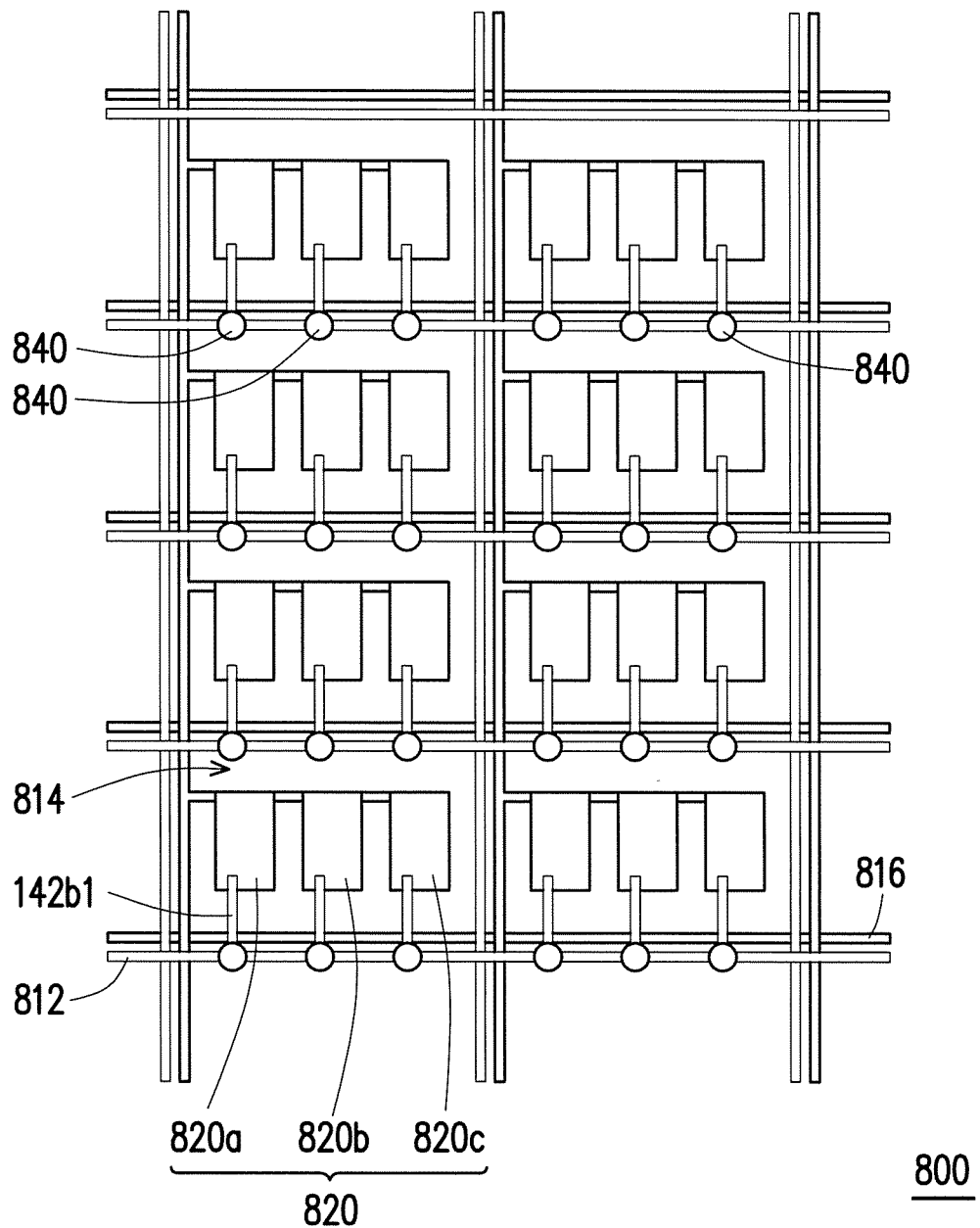
FIGS. 9 to 11 are schematic views illustrating a partial layout of a display device according to eighth to tenth embodiments of the disclosure.

FIG. 9 is a schematic view illustrating a partial layout of a display device according to an eighth embodiment of the disclosure. In a display device 800 shown in FIG. 9, the same components are configured and function in a way similar to that of the embodiment of FIG. 2. Thus, details in this respect will not be repeated in the following. In the embodiment, a plurality of light emitting components 820 are provided. The light emitting components 820 include a plurality of first light emitting components 820*a*, a plurality of second light emitting components 820*b*, and a plurality of third light emitting components 820*c*. A first substrate 810 has a plurality of pixel areas 814 arranged into groups. Each of the pixel areas 814 has one of the first light emitting components 820*a*, one of the second light emitting components 820*b*, and one of the third light emitting components 820*c* connected in parallel. The first light emitting components 820*a*, the second light emitting components 820*b*, and the third light emitting components 820*c* are respectively configured to directly provide red light, green light, and blue light or configured together with a wavelength conversion layer or a color filter film to provide red light, green light, and blue light, for example. A common line 812 is arranged laterally, i.e., parallel to a scan line 816, and is electrically connected to respective conductive elements 840.

In the embodiment, when one of the first light emitting component 820*a*, the second light emitting component 820*b*, and the third light emitting component 820*c* is damaged, due to the characteristic of a parallel connection circuit, light emitting capabilities of the rest of the first light emitting component 820*a*, the second light emitting component 820*b*, and the third light emitting component 820*c* are not affected. Accordingly, the influence when some of the light emitting components 820 are damaged on the display device 800 is reduced.

Figure 10:
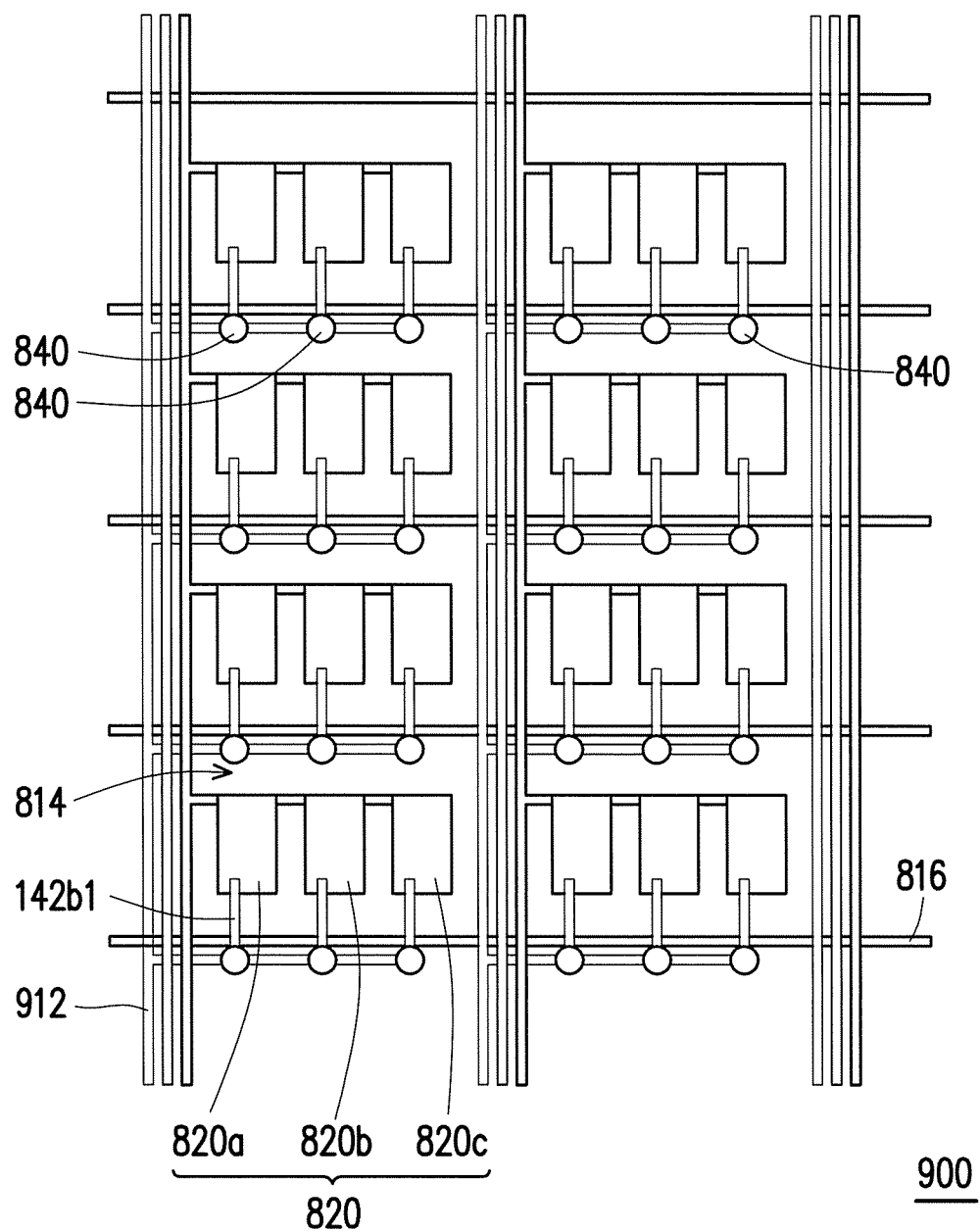

FIG. 10 is a schematic view illustrating a partial layout of a display device according to a ninth embodiment of the disclosure. In a display device 900 shown in FIG. 10, the same components are configured and function in a way similar to that of the embodiment of FIG. 9. Thus, details in this respect will not be repeated in the following. In the embodiment, a common line 912 is arranged vertically, i.e., perpendicular to the scan line 816. Therefore, the embodiment is able to achieve a similar function with different parallel connection structures to allow the designer to bring forth a more suitable arrangement based on practical needs.

Figure 11:
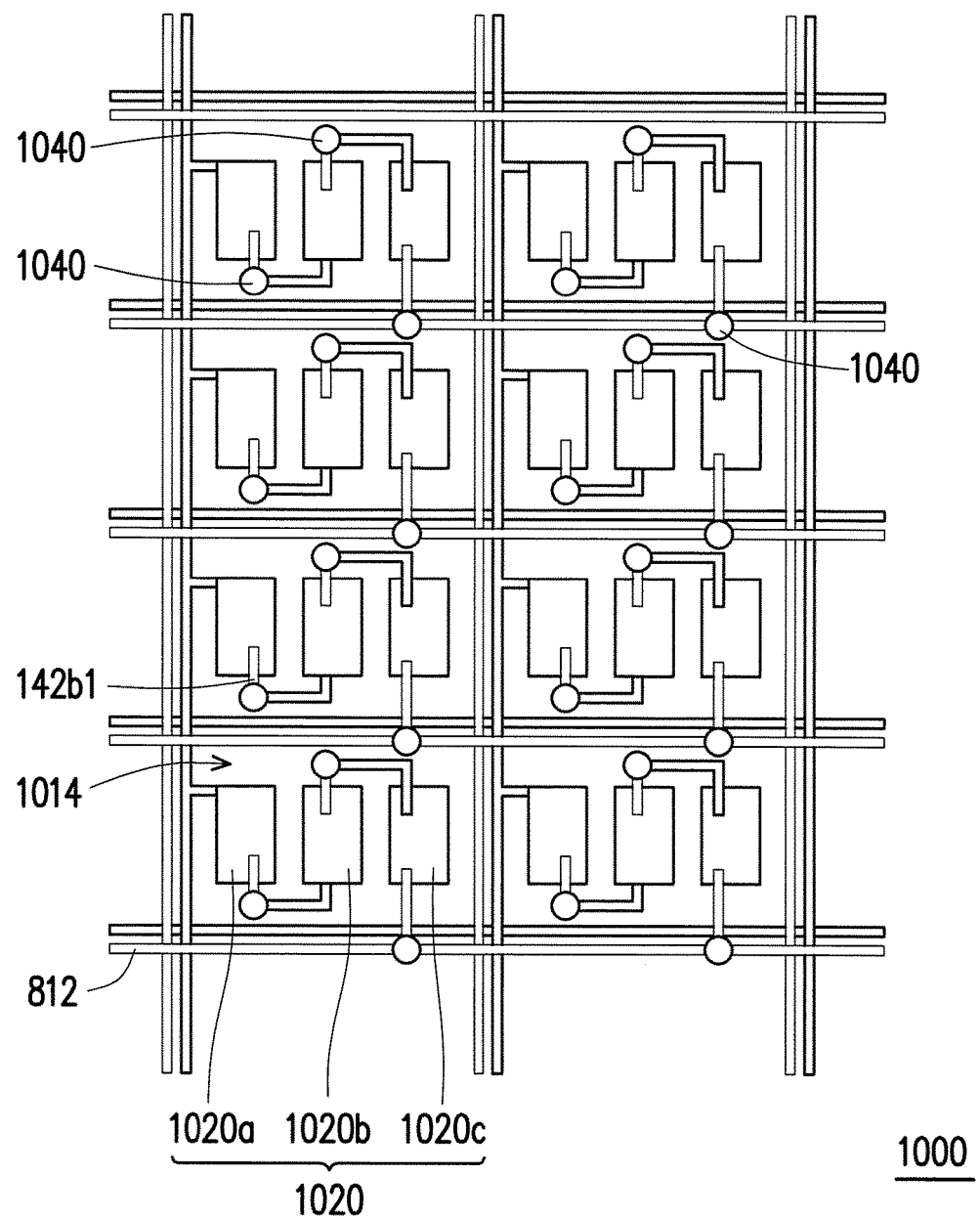

FIG. 11 is a schematic view illustrating a partial layout of a display device according to a tenth embodiment of the disclosure. In a display device 1000 shown in FIG. 11, the same components are configured and function in a way similar to that of the embodiment of FIG. 9. Thus, details in this respect will not be repeated in the following. In the embodiment, light emitting components 1020 are serially connected through conductive elements 1040. In each pixel area 1040, a first light emitting component 1020a, a second light emitting component 1020b, and a third light emitting component 1020c in serial connection are disposed.

FIG. 12 is a schematic partial cross-sectional view illustrating a display device according to an eleventh embodiment of the disclosure. In a display device 1100 shown in FIG. 12, the same components are configured and function in a way similar to that of the embodiment of FIG. 3. Thus, details in this respect will not be repeated in the following. In the embodiment, a wavelength conversion layer 1123 or a color filter film is disposed on the light emitting surface 122a of the light emitting component 120. The embodiment takes the wavelength conversion layer 1123 as an example. The wavelength conversion layer 1123 may be one of a phosphorous layer, a fluorescent layer, and a quantum dot layer. However, the disclosure is not limited thereto. In the embodiment, the wavelength conversion layer 1123 may convert the light emitted by the light emitting component 120 through the light emitting surface 122a into light of different colors and emit the converted light. By directly disposing the wavelength conversion layer 1123 on the light emitting surface 122a of the light emitting component 120, an alignment process required when the two components are manufactured separately may be omitted. Therefore, the overall manufacturing process of the display device 1100 becomes easier. Besides, by incorporating the wavelength conversion layer 1123 onto the light emitting component 120 in advance, the waste of material may be reduced, making the overall material usage more efficient.

FIG. 13 is a schematic partial cross-sectional view illustrating a display device according to a twelfth embodiment of the disclosure. In a display device 1200 shown in FIG. 13, the same components are configured and function in a way similar to that of the embodiment of FIG. 12. Thus, details in this respect will not be repeated in the following. In the embodiment, a wavelength conversion layer or a color filter film 1224 is disposed on the light emitting surface 122a of the light emitting component 120. The embodiment takes the color filter film 1224 as an example. However, the disclosure is not limited thereto. The light emitted from the light emitting surface 122a is configured to enter the color filter film 1224. The color filter film 1224 only allows light in a specific color to pass through, thereby enabling colored display.

Figure 14:
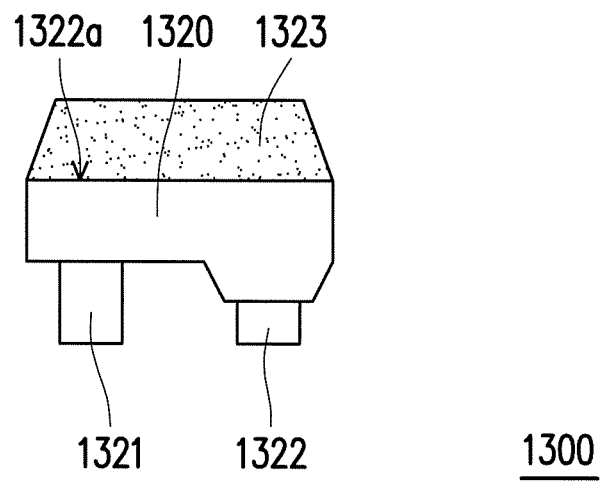

FIG. 14 is a schematic partial cross-sectional view illustrating a display device according to a thirteenth embodiment of the disclosure. In the embodiment, a first electrode 1321 and a second electrode 1322 of a light emitting component 1320 are located on the same side. A wavelength conversion layer 1323 is disposed on a light emitting surface 1322a of the light emitting component 1320. By disposing the wavelength conversion layer 1323 on the light emitting surface 1322a of the light emitting component 1320, a wavelength conversion layer on the second substrate may be omitted, so as to reduce the waste of material and the cost.

Figure 15:
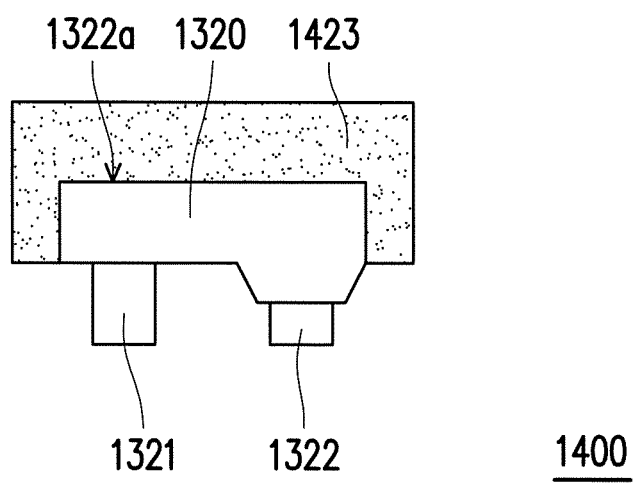

FIG. 15 is a schematic partial cross-sectional view illustrating a display device according to a fourteenth embodiment of the disclosure. In a display device 1400 shown in FIG. 15, the same components are configured and function in a way similar to that of the embodiment of FIG. 14. Thus, details in this respect will not be repeated in the following. In the embodiment, a wavelength conversion layer 1423 further covers a side surface of the light emitting component 1320. By increasing a coverage area of the wavelength conversion layer 1423, the display performance of the display device 1400 is facilitated.

Figure 16:
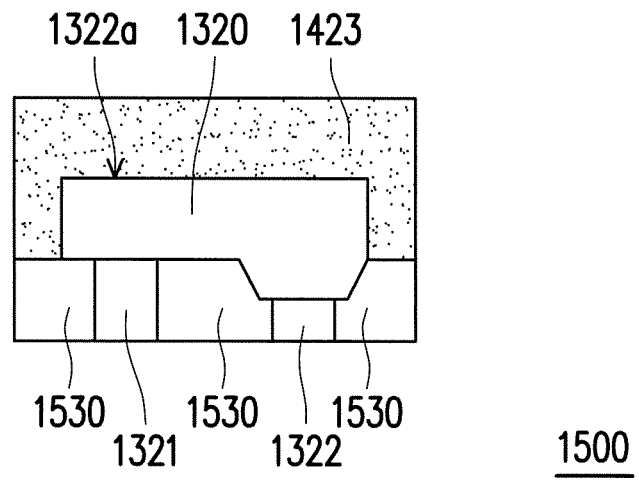

FIG. 16 is a schematic partial cross-sectional view illustrating a display device according to a fifteenth embodiment of the disclosure. In a display device 1500 shown in FIG. 16, the same components are configured and function in a way similar to that of the embodiment of FIG. 15. Thus, details in this respect will not be repeated in the following. In the embodiment, an insulating layer 1530 is filled around the light emitting component 1320. For example, the insulating layer 1530 is a polymer, such as resin, so as to facilitate electrical insulation and overall structural strength. However, the disclosure is not limited thereto.

Figure 17:
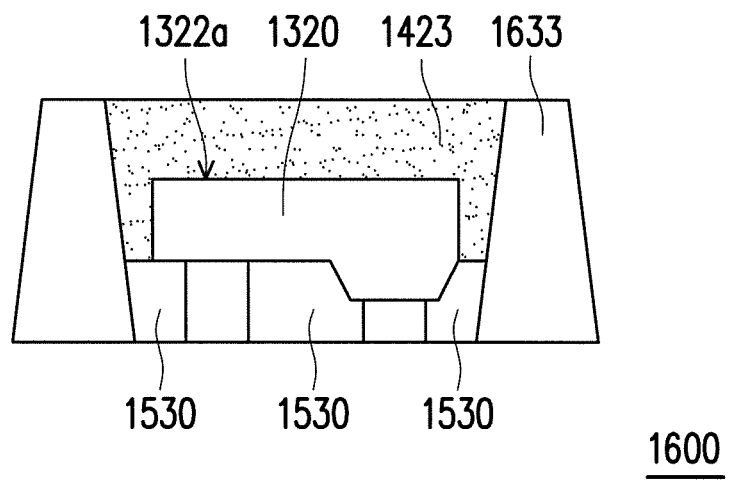

FIG. 17 is a schematic partial cross-sectional view illustrating a display device according to a sixteenth embodiment of the disclosure. In a display device 1600 shown in FIG. 17, the same components are configured and function in a way similar to that of the embodiment of FIG. 16. Thus, details in this respect will not be repeated in the following. In the embodiment, the display device 1600 further includes a light shielding column 1633 disposed around the light emitting component 1320, so as to prevent the adjacent light emitting components 1320 from interfering each other.

Figure 18:
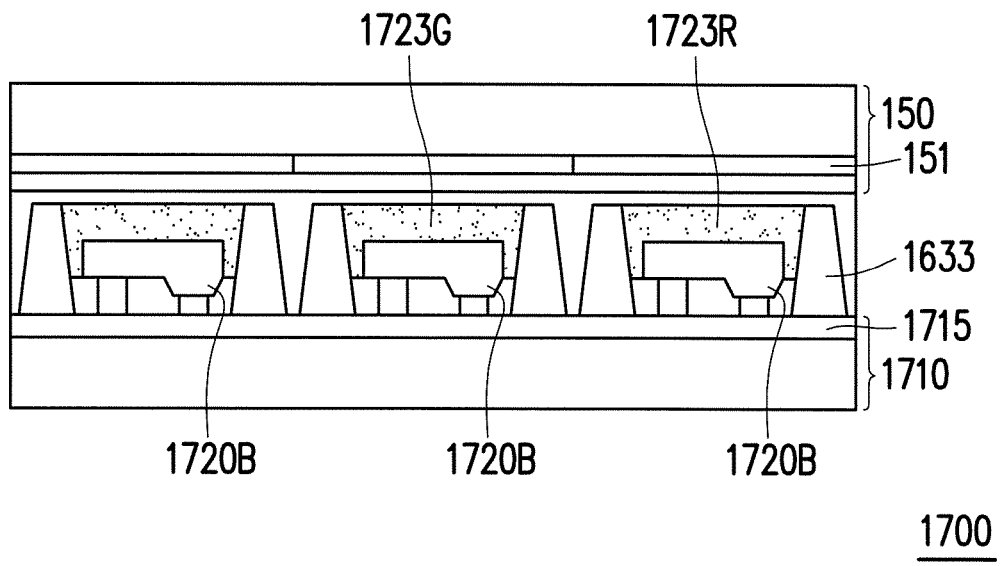

FIG. 18 is a schematic partial cross-sectional view illustrating a display device according to a seventeenth embodiment of the disclosure. In the embodiment, a first substrate 1710 includes an anisotropic conductive film 1715. The light emitting component is electrically connected with circuits on the first substrate through the anisotropic conductive film 1715. The light emitting component is a blue light emitting diode 1720B, and the wavelength conversion layer includes a red wavelength conversion layer 1723R and a green wavelength conversion layer 1723G. Light emitted by the blue light emitting diode 1720B is absorbed by the red wavelength conversion layer 1723R or the green wavelength conversion layer 1723G, and the red wavelength conversion layer 1723R or the green wavelength conversion layer 1723G emits red light or green light. After the color filter film 151 located at the second substrate 150 receives the light emitted from the wavelength conversion layer, the color filter film 151 filters light again.

Figure 19:
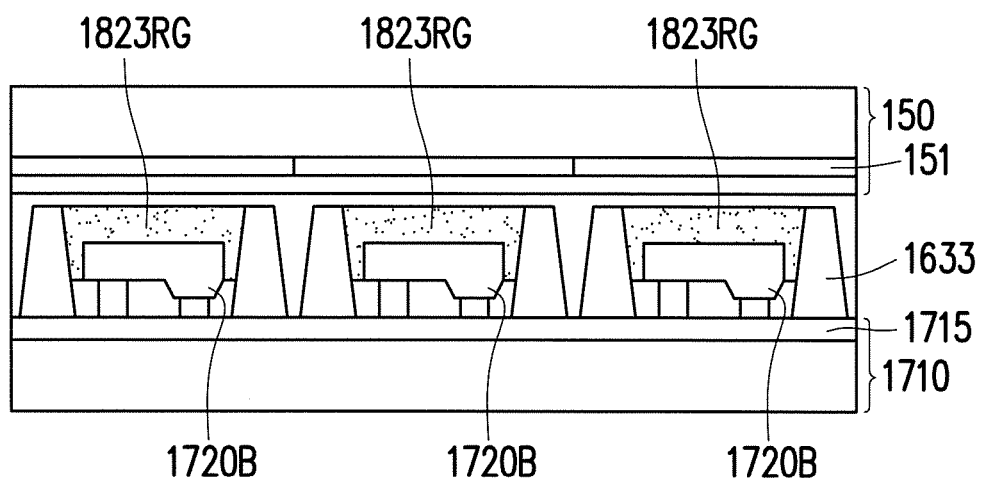

FIG. 19 is a schematic partial cross-sectional view illustrating a display device according to an eighteenth embodiment of the disclosure. In a display device 1800 shown in FIG. 19, the same components are configured and function in a way similar to that of the embodiment of FIG. 18. Thus, details in this respect will not be repeated in the following. In the embodiment, the wavelength conversion layer is a red and green wavelength conversion layer 1823RG formed by mixing different materials. Light passing through the red and green wavelength conversion layer 1823RG is further filtered by the color filter film 151 for colored display. In the embodiment, a red quantum dot and a green quantum dot may be mixed to form the red and green wavelength conversion layer 1823RG. However, the disclosure is not limited thereto. In other embodiments, it is also plausible to form a wavelength conversion layer having a red quantum dot and then form a wavelength conversion layer having a green quantum dot. Alternatively, the layers may be formed in a reversed order.

Figure 20:
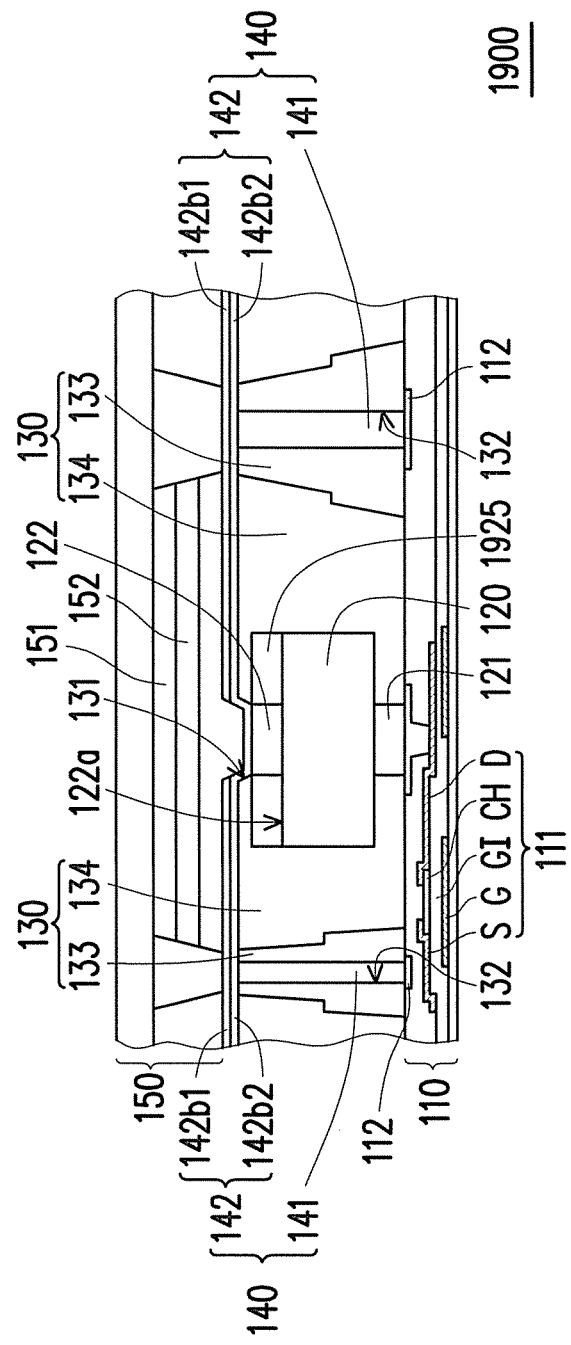

FIG. 20 is a schematic partial cross-sectional view illustrating a display device according to a nineteenth embodiment of the disclosure. In a display device 1900 shown in FIG. 20, the same components are configured and function in a way similar to that of the embodiment of FIG. 12. Thus, details in this respect will not be repeated in the following. In the embodiment, an ultraviolet light resistant layer 1925 is disposed on the light emitting surface 122a of the light emitting component 120. With such configuration, ambient incident light whose wavelength is shorter than a wavelength of emission of the light emitting component or the quantum dot may be prevented from being irradiated to the light emitting component 120 and generating redundant visible light. Accordingly, the display effect of the display device 1900 is facilitated. For example, the ambient ultraviolet light may be irradiated to the light emitting component 120, and the ultraviolet light has a shorter wavelength than the wavelength of emission of the light emitting component or the quantum dot. Thus, the ambient ultraviolet light may be converted into redundant visible light by the light emitting component or the quantum dot, and the display effect may thus be affected. In another embodiment, the ultraviolet light resistant layer 1925 may be disposed on the second substrate. Accordingly, before being irradiated to the quantum dot layer or the light emitting component, the incident light may be blocked by the ultraviolet light resistant layer 1925.

Figure 21:
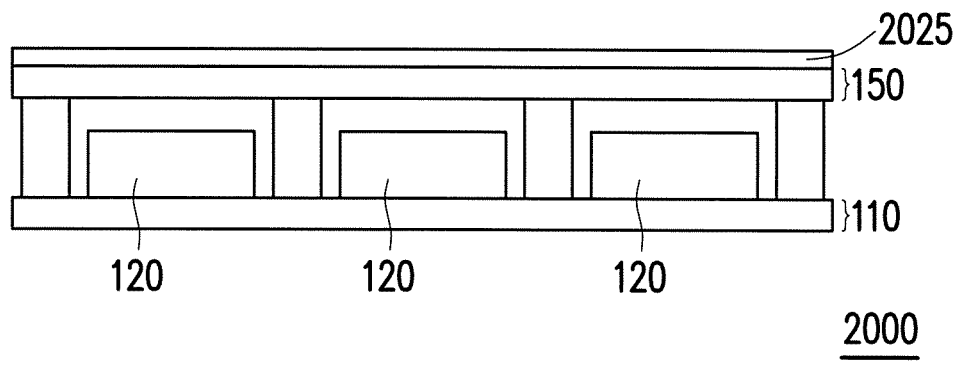

FIG. 21 is a schematic partial cross-sectional view illustrating a display device according to a twentieth embodiment of the disclosure. In the embodiment, an ultraviolet light resistant layer 2025 is disposed on a side of the second substrate 150 away from the first substrate 110. Accordingly, the ultraviolet light resistant layer 2025 may have an increased area to facilitate a blocking effect against ultraviolet light.

Figure 22:
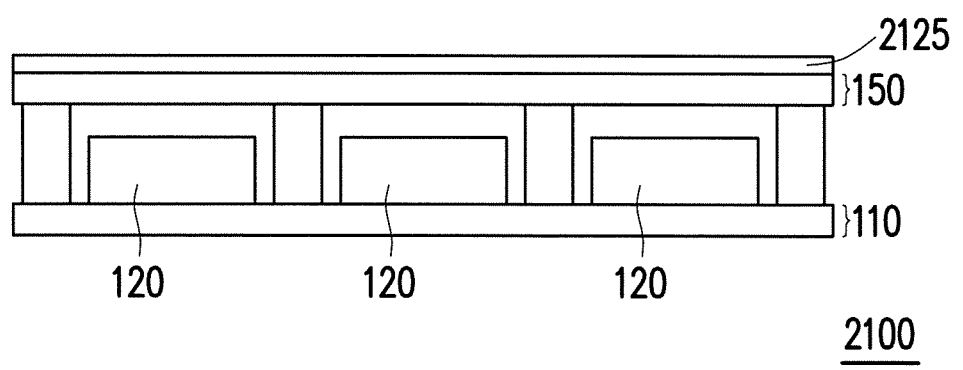

FIG. 22 is a schematic partial cross-sectional view illustrating a display device according to a twenty-first embodiment of the disclosure. In a display device 2100 shown in FIG. 22, the same components are configured and function in a way similar to that of the embodiment of FIG. 21. Thus, details in this respect will not be repeated in the following. In the embodiment, a polarizing layer 2125 is disposed on the side of the second substrate 150 away from the first substrate 110. The polarizing layer 2125 may be a linear polarizing layer, a circular polarizing layer, or polarizing layers of other types. The polarizing layer 2125 is capable of reducing the influence of external light on the display device 2100.

Figure 23:
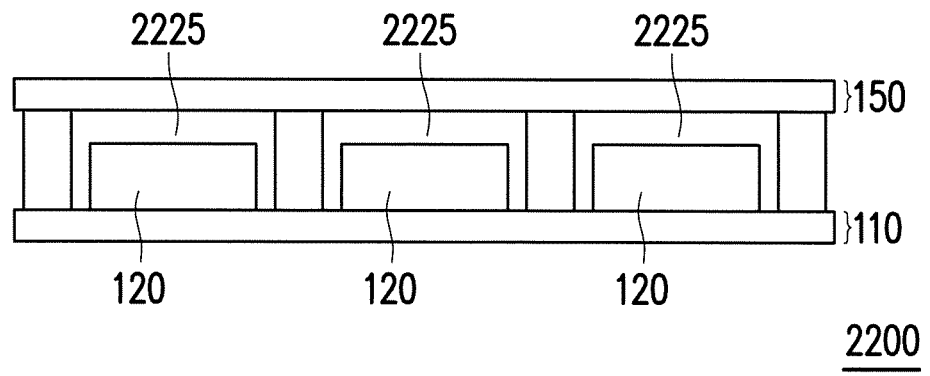

FIG. 23 is a schematic partial cross-sectional view illustrating a display device according to a twenty-second embodiment of the disclosure. In a display device 2200 shown in FIG. 23, the same components are configured and function in a way similar to that of the embodiment of FIG. 21. Thus, details in this respect will not be repeated in the following. In this embodiment, an ultraviolet light resistant layer 2225 is formed by mixing an ultraviolet light resistant material and a polymer, such as resin, for example. However, the disclosure is not limited thereto. The ultraviolet light resistant layer 2225 may be filled around the light emitting component 120.

Figure 24:
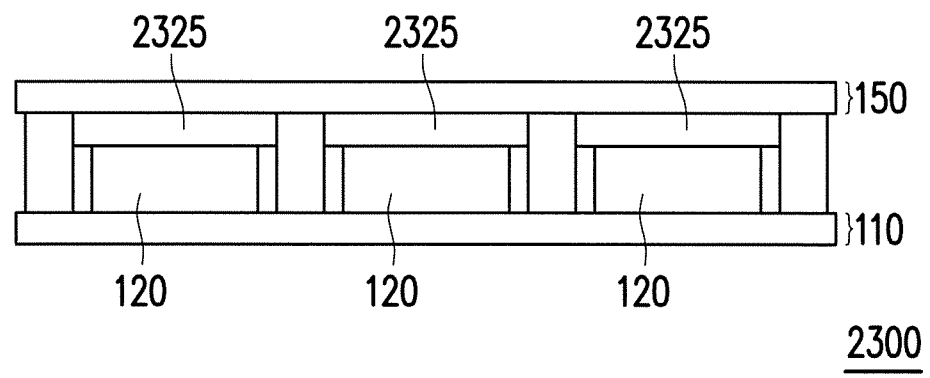

FIG. 24 is a schematic partial cross-sectional view illustrating a display device according to a twenty-third embodiment of the disclosure. In a display device 2300 shown in FIG. 24, the same components are configured and function in a way similar to that of the embodiment of FIG. 23. Thus, details in this respect will not be repeated in the following. In the embodiment, an ultraviolet light resistant layer 2325 is only disposed on an upper part of the light emitting component 120, and a side edge of the light emitting component 120 is only filled by a polymer, such as resin. However, the disclosure is not limited thereto. Accordingly, the disclosure reduces the consumption of the ultraviolet light resistant material and facilitate the material usage efficiency.

Figure 25:
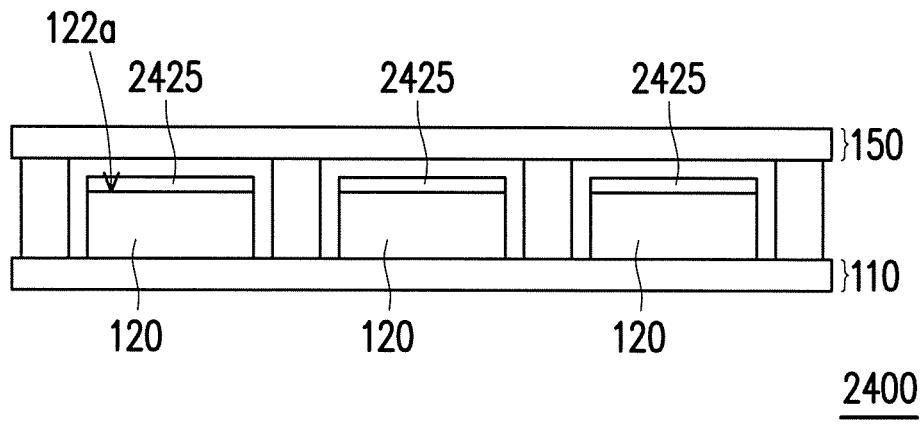

FIG. 25 is a schematic partial cross-sectional view illustrating a display device according to a twenty-fourth embodiment of the disclosure. In a display device 2400 shown in FIG. 25, the same components are configured and function in a way similar to that of the embodiment of FIG. 24. Thus, details in this respect will not be repeated in the following. In the embodiment, an ultraviolet light resistant layer 2425 only covers the light emitting surface 122a of the light emitting component 120, so as to further reduce the consumption of the ultraviolet light resistant material.

Figure 26:
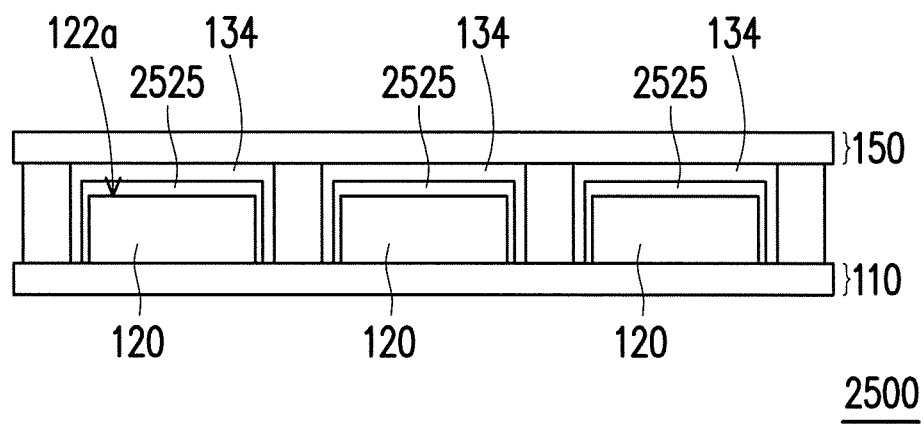

FIG. 26 is a schematic partial cross-sectional view illustrating a display device according to a twenty-fifth embodiment of the disclosure. In a display device 2500 shown in FIG. 26, the same components are configured and function in a way similar to that of the embodiment of FIG. 25. Thus, details in this respect will not be repeated in the following. In the embodiment, the ultraviolet light resistant layer 2525 further covers a side surface of the light emitting component 120, and the ultraviolet light resistant layer 2525 is disposed between the filling material 134 and the light emitting component 120. Accordingly, the embodiment uses less ultraviolet light resistant material while facilitate the blocking performance against ultraviolet light.

Figure 27:
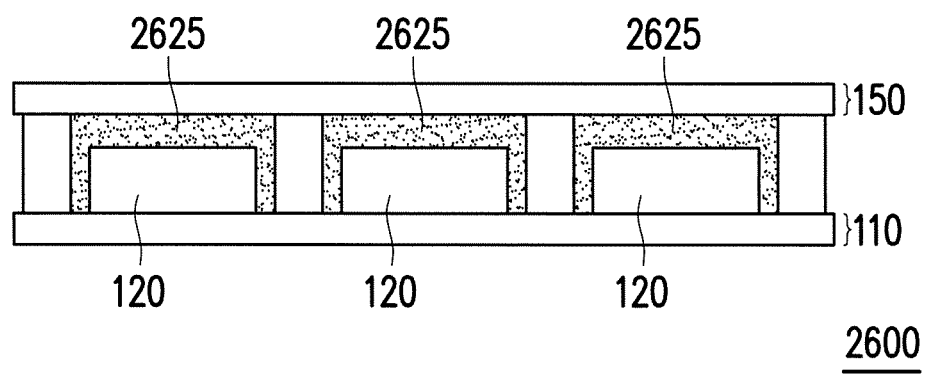

FIG. 27 is a schematic partial cross-sectional view illustrating a display device according to a twenty-sixth embodiment of the disclosure. In a display device 2600 shown in FIG. 27, the same components are configured and function in a way similar to that of the embodiment of FIG. 23. Thus, details in this respect will not be repeated in the following. In the embodiment, an ultraviolet light resistant layer 2625 is formed by mixing resin and ultraviolet light resistant particles. Accordingly, the consumption of the ultraviolet light material is reduced.

Figure 28:
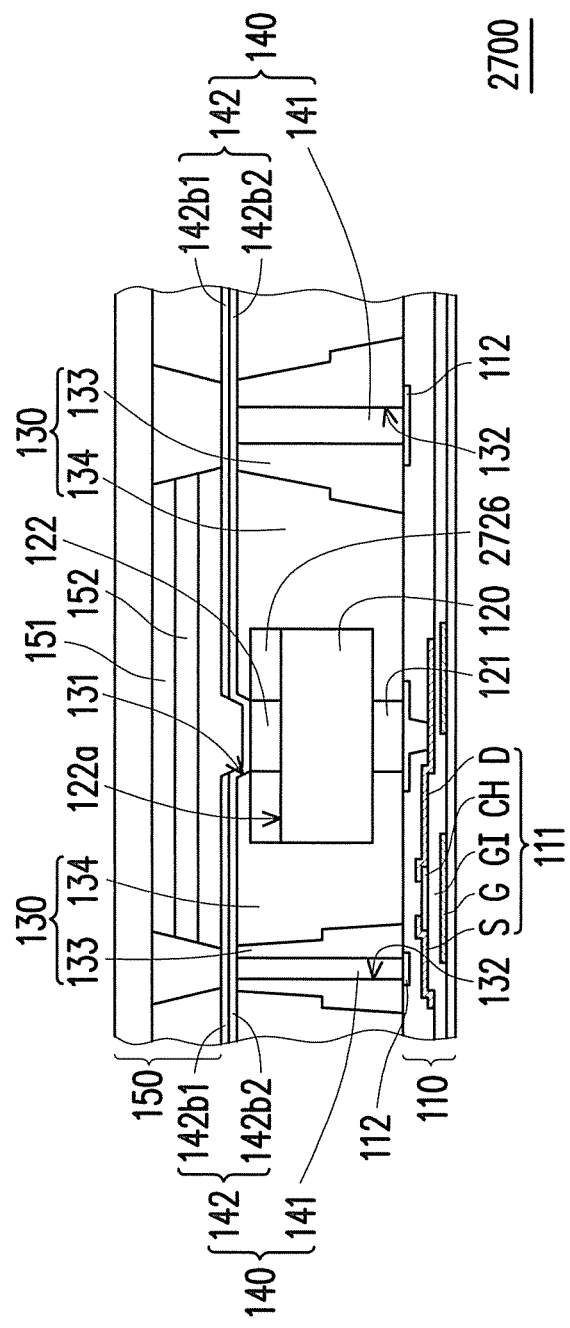
Figure 29:
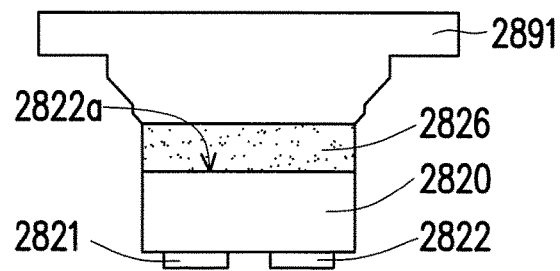
FIGS. 29 to 32 are schematic partial cross-sectional views illustrating a manufacturing process of a display device according to a twenty-eighth embodiment of the disclosure.

FIG. 28 is a schematic partial cross-sectional view illustrating a display device according to a twenty-seventh embodiment of the disclosure. In a display device 2700 shown in FIG. 28, the same components are configured and function in a way similar to that of the embodiment of FIG. 12. Thus, details in this respect will not be repeated in the following. In the embodiment, a light scattering layer 2726 is disposed on the light emitting surface 122a of the light emitting component 120. The light emitted by the light emitting component 120 from the light emitting surface 122a may be uniformly scattered by the light scattering layer 2726 disposed on the light emitting surface 122a.

Figure 30:
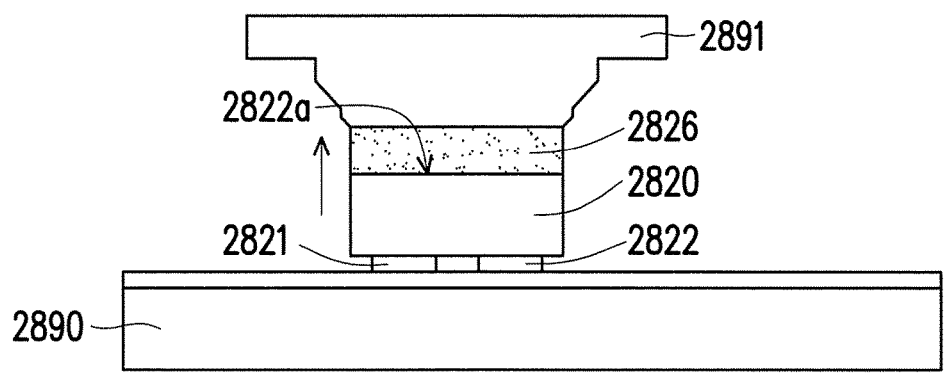
Figure 31:
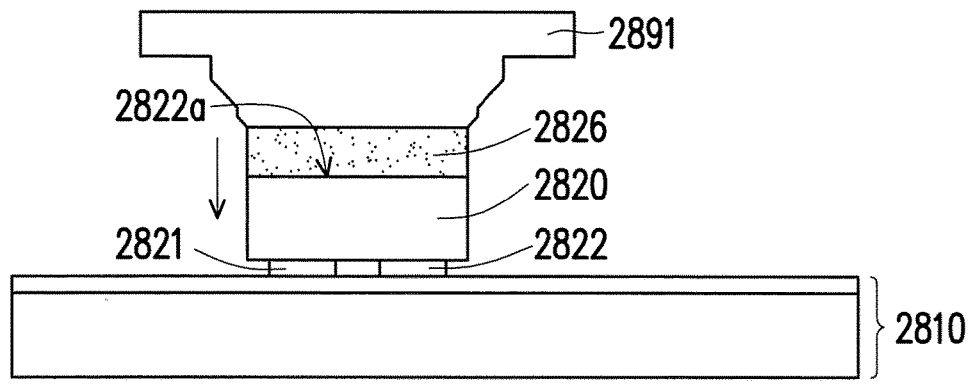
Figure 32:
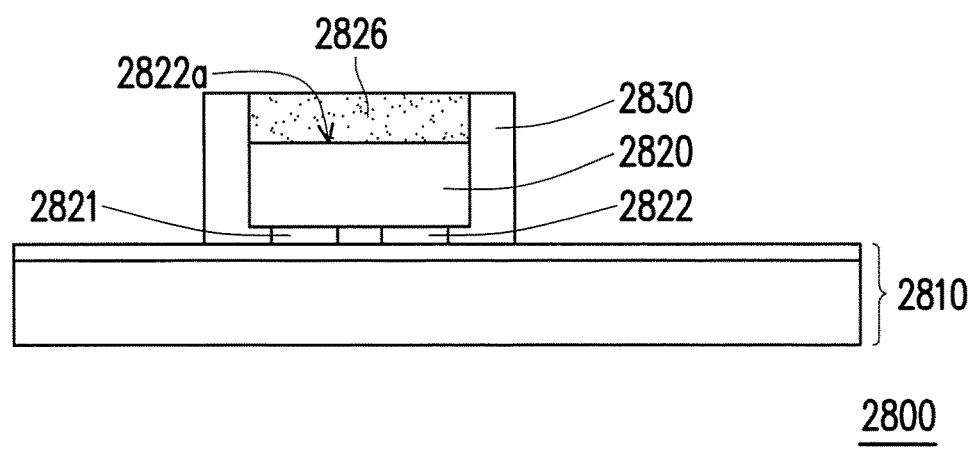

FIGS. 29 to 32 are schematic partial cross-sectional views illustrating a manufacturing process of a display device according to a twenty-eighth embodiment of the disclosure. In the embodiment, a first electrode 2821 and a second electrode 2822 of a light emitting component 2820 are located on the same side. A light scattering layer 2826 may be directly disposed on a light emitting surface 2822a of the light emitting component 2820. In the embodiment, the light scattering layer 2826 may be formed by mixing resin with scattering particles. Referring to FIG. 30, the light scattering layer 2826 may be firstly disposed on the light emitting surface 2822a of the light emitting component 2820, and the light emitting component 2820 may be picked from a third substrate 2890 by having a pickup head 2891 contact the light scattering layer 2826. Since the pickup head 2891 contacts the light scattering layer 2826 without directly contacting the light emitting component 2820, the chance that the pickup head 2891 damages the light emitting component 2820 is reduced. Referring to FIG. 31, the picked light emitting component 2820 may be bonded with a first substrate 2810. Referring to FIG. 32, after the light emitting component 2820 is configured, an insulating layer 2830 may be further filled around the light emitting component 2820.

Figure 33:
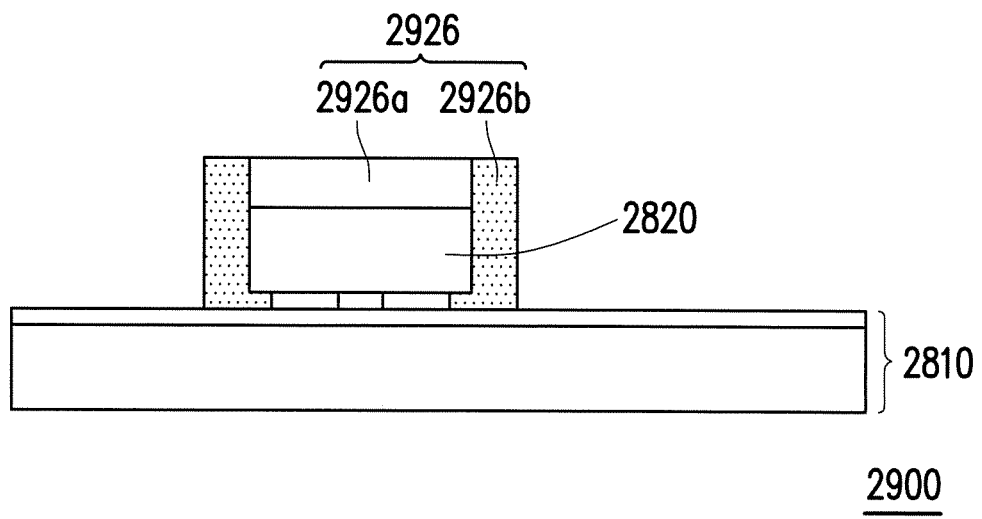
FIG. 33 is a schematic partial cross-sectional view illustrating a display device according to a twenty-ninth embodiment of the disclosure.

FIG. 33 is a schematic partial cross-sectional view illustrating a display device according to a twenty-ninth embodiment of the disclosure. In a display device 2900 shown in FIG. 33, the same components are configured and function in a way similar to that of the embodiment of FIG. 32. Thus, details in this respect will not be repeated in the following. In the embodiment, a light scattering layer 2926 further covers a side surface of the light emitting component 2820. The light scattering layer 2926 includes a first light scattering layer 2926a and a second light scattering layer 2926b. The first light scattering layer 2926a and the second light scattering layer 2926b are not formed at the same time, and the first light scattering layer 2926a and the second light scattering layer 2926b may include the same or different materials.

Figure 34:
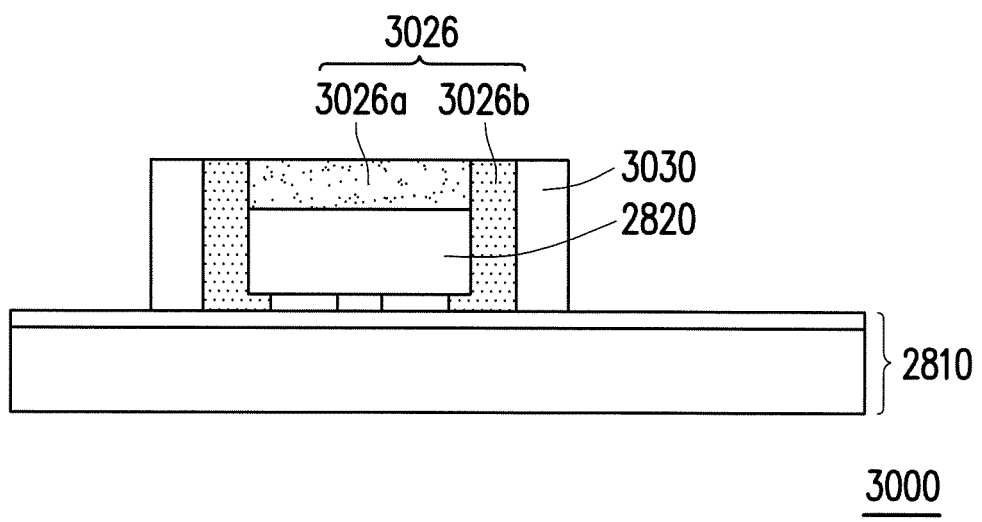
FIG. 34 is a schematic partial cross-sectional view illustrating a display device according to a thirtieth embodiment of the disclosure.

FIG. 34 is a schematic partial cross-sectional view illustrating a display device according to a thirtieth embodiment of the disclosure. In a display device 3000 shown in FIG. 34, the same components are configured and function in a way similar to that of the embodiment of FIG. 33. Thus, details in this respect will not be repeated in the following. In the embodiment, a light scattering layer 3026 is disposed between an insulating layer 3030 and the light emitting component 2820. A first light scattering layer 3026a and a second light scattering layer 3026b are formed in different steps. The first light scattering layer 3026a is directly formed on the light emitting component 2820, whereas the second light scattering layer 3026b is formed after the light emitting component 2820 is bonded with the substrate. With the insulating layer 3030 in a dark color, the light emitting components 2820 may be prevented from interfering each other.

In view of the foregoing, in the display device according to the embodiments of the disclosure, the common line and the driving component are located on the same substrate, and the conductive element may extend upward from the common line and be electrically connected with another electrode of the light emitting component. Accordingly, it neither requires another substrate to dispose the common line or common electrode nor requires to align and bond the another substrate with another electrode of the light emitting component. Accordingly, the manufacturing time is saved, the cost is reduced, and the yield rate is facilitated.

It will be apparent to those skilled in the art that various modifications and variations can be made to the structure of the disclosure without departing from the scope or spirit of the disclosure. In view of the foregoing, it is intended that the disclosure covers modifications and variations of the disclosure provided they fall within the scope of the following claims and their equivalents.

What is claimed is:

1. A display device, comprising:
   a first substrate, having a driving component and a common line;
   a light emitting component, disposed on the first substrate and having a first electrode and a second electrode, wherein the first electrode is electrically connected to the driving component;
   an insulating layer, disposed on the first substrate and having a first opening and a second opening, wherein the first opening exposes the second electrode of the light emitting component, and the second opening exposes the common line; and
   a conductive element, wherein the common line is electrically connected to the second electrode through the conductive element,
   wherein the insulating layer comprises a light shielding column and a filling material, the filling material is filled between the light emitting component and the light shielding column, the filling material has the first opening, and the light shielding column has the second opening.

2. The display device as claimed in claim 1, wherein the conductive element comprises a first portion and a second portion, the first portion is located in the second opening, the second portion is located outside the second opening, and a material of the first portion comprises metal.

3. The display device as claimed in claim 2, wherein the second portion comprises a transparent conductive layer.

4. The display device as claimed in claim 2, wherein the second portion is a composite layer comprising metal and a transparent conductive material.

5. The display device as claimed in claim 1, wherein the conductive element fills the second opening.

6. The display device as claimed in claim 1, further comprising a second substrate having a color filter film, wherein the light emitting component is located between the first substrate and the color filter film, and an orthogonal projection of the color filter film on the first substrate overlaps with an orthogonal projection of the light emitting component on the first substrate.

7. The display device as claimed in claim 6, wherein the second substrate further comprises a light scattering layer or a quantum dot layer located between the color filter film and the light emitting component.

8. The display device as claimed in claim 1, wherein a wavelength conversion layer is disposed on a light emitting surface of the light emitting component.

9. The display device as claimed in claim 8, wherein the wavelength conversion layer further covers a side surface of the light emitting component.

10. The display device as claimed in claim 1, wherein a color filter film is disposed on a light emitting surface of the light emitting component.

11. The display device as claimed in claim wherein an ultraviolet light resistant layer is disposed on a light emitting surface of the light emitting component.

12. The display device as claimed in claim 1, wherein a light scattering layer is disposed on a light emitting surface of the light emitting component.

13. The display device as claimed in claim 1, wherein the light emitting component is a micron-size light emitting diode.

14. The display device as claimed in claim 1, wherein the driving component is an amorphous silicon thin film transistor, an oxide semiconductor thin film transistor, a low-temperature polycrystalline silicon thin film transistor, a silicon-based thin film transistor or a microcrystalline silicon thin film transistor.

* * * * *